(12) United States Patent
Kitagawa et al.

(10) Patent No.: US 12,312,369 B2
(45) Date of Patent: May 27, 2025

(54) RARE-EARTH COMPLEX, LIGHT-EMITTING MATERIAL, LIGHT-EMITTING OBJECT, LIGHT-EMITTING DEVICE, INTERLAYER FOR LAMINATED GLASS, LAMINATED GLASS, WINDSHIELD FOR VEHICLE, WAVELENGTH CONVERSION MATERIAL, AND SECURITY MATERIAL

(71) Applicant: NATIONAL UNIVERSITY CORPORATION HOKKAIDO UNIVERSITY, Sapporo (JP)

(72) Inventors: Yuichi Kitagawa, Sapporo (JP); Marina Kumagai, Sapporo (JP); Yasuchika Hasegawa, Sapporo (JP); Takayuki Nakanishi, Sapporo (JP); Koji Fushimi, Sapporo (JP)

(73) Assignee: NATIONAL UNIVERSITY CORPORATION HOKKAIDO UNIVERSITY, Sapporo (JP)

( * ) Notice: Subject to any disclaimer, the term of this patent is extended or adjusted under 35 U.S.C. 154(b) by 1174 days.

(21) Appl. No.: 17/258,320

(22) PCT Filed: Jul. 4, 2019

(86) PCT No.: PCT/JP2019/026751
§ 371 (c)(1),
(2) Date: Jan. 6, 2021

(87) PCT Pub. No.: WO2020/013087
PCT Pub. Date: Jan. 16, 2020

(65) Prior Publication Data
US 2021/0269460 A1    Sep. 2, 2021

(30) Foreign Application Priority Data
Jul. 10, 2018   (JP) .................................. 2018-130925

(51) Int. Cl.
*C07F 5/00* (2006.01)
*B32B 17/10* (2006.01)
(Continued)

(52) U.S. Cl.
CPC ........ *C07F 5/003* (2013.01); *B32B 17/10036* (2013.01); *B32B 17/10174* (2013.01);
(Continued)

(58) Field of Classification Search
None
See application file for complete search history.

(56) References Cited

U.S. PATENT DOCUMENTS 8,975,385 B2 * 3/2015 Hasegawa ............... C07F 9/572
534/15
2016/0343950 A1 * 11/2016 Kawamura ........... C07F 9/5325

FOREIGN PATENT DOCUMENTS

CN    1687080 A    10/2005
CN    103320117 A    9/2013
(Continued)

OTHER PUBLICATIONS

Kitagawa et al (Visible luminescent lanthanide ions and a large p-conjugated ligand system shake hands. Phys. Chem. Chem. Phys., 2016, 18, 31012-31016). (Year: 2016).*
(Continued)

*Primary Examiner* — Jake M Vu
(74) *Attorney, Agent, or Firm* — Sughrue Mion, PLLC (57) ABSTRACT

A rare-earth complex including a rare-earth ion, and a ligand coordinate-bonded to the rare-earth ion and having a condensed polycyclic aromatic group. The condensed polycyclic aromatic group is a residue formed by removing a hydrogen atom bonded to a condensed aromatic ring from a condensed polycyclic aromatic compound represented by the following Formula (I).
(Continued)

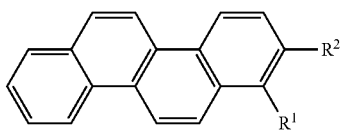

(I)

In Formula (I), $R^1$ and $R^2$ represent hydrogen atoms or groups which are bonded to each other to form one aromatic ring or a condensed aromatic ring including two or more aromatic rings.

14 Claims, 6 Drawing Sheets (51) Int. Cl.
H10H 20/851 (2025.01)
H10K 85/30 (2023.01)
(52) U.S. Cl.
CPC ..... *B32B 17/10761* (2013.01); *H10H 20/851* (2025.01); *H10K 85/351* (2023.02); *B32B 2605/08* (2013.01)

(56) References Cited

FOREIGN PATENT DOCUMENTS

| CN | 105431441 A | 3/2016 |
|---|---|---|
| CN | 105473600 A | 4/2016 |
| JP | 2002-124383 A | 4/2002 |
| JP | 2005-8872 A | 1/2005 |
| JP | 2007-269780 A | 10/2007 |
| JP | 2008-159604 A | 7/2008 |
| JP | 2016-166139 A | 9/2016 |
| WO | 2012/150712 A1 | 11/2012 |
| WO | 2018/155557 A1 | 8/2018 |

OTHER PUBLICATIONS

Yuan-yuan Li et al., "The Luminescent Mechanism and Application of Rare Earth Complex", Journal of Jinan University(Sci & Tech.), vol. 19, No. 2, Jun. 2005, pp. 113-119 (7 total pages).

Steemers, F. J. et al., "Water-Soluble Neutral Calix[4]arene-Lanthanide Complexes; Synthesis and Luminescence Properties", Journal of Organic Chemistry, 1997, vol. 62, No. 13, p. 4229-p. 4235 (7 Pages total).

Kitagawa, Y. et al., "Visible luminescent lanthanide ions and a large π-conjugated ligand system shake hands", Physical Chemistry Chemical Physics, 2016, vol. 18, No. 45, p. 31012-p. 31016 (5 Pages Total).

Kitagawa, Y. et al., "A highly luminescent Eu(III) complex based on an electronically isolated aromatic ring system with ultralong lifetime", Dalton Transactions, May 17, 2018, vol. 47, No. 21, p. 7327-p. 7332 (6 Pages Total).

Osawa, M. et al., "Intra-Complex Energy Transfer of Europium(III) Complexes Containing Anthracene and Phenanthrene Moieties", Journal of Physical Chemistry A, 2009, vol. 113, No. 41,p. 10895-p. 10902 ( 8 Pages Total).

International Search Report dated Sep. 17, 2019 from the International Searching Authority in International Application No. PCT/JP2019/026751.

International Preliminary Report on Patentability dated Jan. 14, 2021 from the International Bureau in International Application No. PCT/JP2019/026751.

* cited by examiner

RARE-EARTH COMPLEX, LIGHT-EMITTING MATERIAL, LIGHT-EMITTING OBJECT, LIGHT-EMITTING DEVICE, INTERLAYER FOR LAMINATED GLASS, LAMINATED GLASS, WINDSHIELD FOR VEHICLE, WAVELENGTH CONVERSION MATERIAL, AND SECURITY MATERIAL

CROSS REFERENCE TO RELATED APPLICATIONS

This application is a National Stage of International Application No. PCT/JP2019/026751 filed Jul. 4, 2019, claiming priority based on Japanese Patent Application No. 2018-130925, filed Jul. 10, 2018.

TECHNICAL FIELD

The present invention relates to a rare-earth complex, a light-emitting material, a light-emitting object, a light-emitting device, an interlayer for a laminated glass, a laminated glass, a windshield for a vehicle, a wavelength conversion material, and a security material.

BACKGROUND ART

As a rare-earth complex which exhibits emission of red light, for example, a europium complex having a hexafluoroacetylacetonate (hfa) derivative and a phosphine oxide compound as ligands has been reported (Patent Literature 1).

CITATION LIST

Patent Literature

Patent Literature 1: Japanese Unexamined Patent Publication No. 2016-166139

SUMMARY OF INVENTION

Technical Problem

For application as a light-emitting material, it is desirable for the rare-earth complex to emit light at an emission intensity as large as possible.

Solution to Problem

An aspect of the present invention relates to a rare-earth complex including a rare-earth ion, and a ligand coordinate-bonded to the rare-earth ion and having a condensed polycyclic aromatic group. The condensed polycyclic aromatic group is a residue formed by removing a hydrogen atom bonded to a condensed aromatic ring of a condensed polycyclic aromatic compound represented by the following Formula (I) from the condensed polycyclic aromatic compound.

(I)

In Formula (I), $R^1$ and $R^2$ represent hydrogen atoms or groups which are bonded to each other to form one aromatic ring or a condensed aromatic ring including two or more aromatic rings. The condensed aromatic ring of the condensed polycyclic aromatic compound represented by Formula (I) optionally has a substituent.

As shown in Formula (I), the rare-earth complex, which has a ligand having a condensed polycyclic aromatic group, emits light at a large emission intensity. The reason for this is considered that the condensed polycyclic aromatic group having a structure in which a plurality of aromatic rings are linked in a zig-zag manner shows an extremely large molar extinction coefficient with respect to visible-ultraviolet light and efficiently causes energy transfer to Eu(III).

Another aspect of the present invention provides a light-emitting material containing the above-described rare-earth complex, a light-emitting object containing the light-emitting material, a wavelength conversion material, and a security material. The light-emitting object can be utilized, for example, as a light source of a light-emitting device. Still another aspect of the present invention relates to an interlayer for a laminated glass, which has a light-emitting layer containing the above-described rare-earth complex, and a laminated glass including the interlayer. This laminated glass can be used, for example, as a windshield for a vehicle having a light-emitting function.

Advantageous Effects of Invention

The rare-earth complex according to the aspect of the present invention can emit light at a large emission intensity. The rare-earth complex according to the aspect of the present invention can be used, for example, as a light-emitting material constituting a light-emitting object which emits red light. The rare-earth complex according to the aspect of the present invention also has high heat resistance.

In addition, the rare-earth complex according to the aspect of the present invention exhibits properties greatly changing emission properties depending on temperatures. Therefore, the rare-earth complex can also be applied as a temperature sensing material.

DESCRIPTION OF EMBODIMENTS

Hereinafter, several embodiments of the present invention will be described in detail. However, the present invention is not limited to the following embodiments.

A rare-earth complex according to an embodiment has a rare-earth ion and a plurality of ligands coordinate-bonded to the rare-earth ion.

The rare-earth ion is, for example, an ion of a rare-earth element selected from europium (Eu), neodymium (Nd), ytterbium (Yb), and gadolinium (Gd). For example, europium as a trivalent cation ($Eu^{3+}$) forms a complex.

At least a part of the plurality of ligands included in the rare-earth complex has a condensed polycyclic aromatic group. This condensed polycyclic aromatic group is a group derived from a condensed polycyclic aromatic compound represented by the following Formula (I). In other words, the condensed polycyclic aromatic group can be a residue formed by removing a hydrogen atom bonded to a condensed aromatic ring of the condensed polycyclic aromatic compound represented by Formula (I).

(I)

In Formula (I), $R^1$ and $R^2$ represent hydrogen atoms or groups which are bonded to each other to form one aromatic ring or a condensed aromatic ring including two or more aromatic rings. $R^1$ and $R^2$ may be bonded to each other to form one 6-membered ring to be condensed with a 6-membered ring to which $R^1$ and $R^2$ are bonded, and $R^1$ and $R^2$ may be bonded to each other to form a condensed aromatic ring composed of two or more 6-membered rings. The total number of 6-membered rings of the condensed polycyclic aromatic compound of Formula (1) may be 4 to 6. The condensed polycyclic aromatic group derived from the condensed polycyclic aromatic compound of Formula (I) may be a monovalent or divalent group formed by removing one or two hydrogen atoms from the condensed aromatic ring. The condensed aromatic ring from which a hydrogen atom may be removed also includes a condensed ring formed by $R^1$ and $R^2$.

The condensed aromatic ring of the condensed polycyclic aromatic compound represented by Formula (I) may have a substituent. The substituent bonded to the condensed aromatic ring may be, for example, an alkyl group such as a methyl group or a halogen atom such as a fluorine atom. A part or all of hydrogen atoms bonded to the condensed aromatic ring may be a deuterium atom.

The condensed polycyclic aromatic compound represented by Formula (I) may be, for example, a compound represented by the following Formula (I-1), (I-2), or (I-3). The condensed aromatic rings of these compounds may have a substituent.

(I-1)

(I-2)

(I-3)

The condensed polycyclic aromatic group derived by removing a hydrogen atom from these compounds may be, for example, a monovalent group represented by the following Formula (I-1a), (I-2a), or (I-2b) and may be a divalent group represented by Formula (I-1b).

(I-1a)

(I-2a)

(I-2b)

(I-1b)

The ligand having a condensed polycyclic aromatic group may be, for example, at least one of a phosphine oxide ligand represented by the following Formula (10) or a diketone ligand represented by the following Formula (20).

(10)

(20)

In Formula (10), Z represents the condensed polycyclic aromatic group derived from the condensed polycyclic aromatic compound of Formula (I) mentioned above, and $R^{11}$ and $R^{12}$ each independently represent an aryl group different from the condensed polycyclic aromatic group. In Formula (20), Z represents the condensed polycyclic aromatic group derived from the condensed polycyclic aromatic compound of Formula (I) mentioned above, and $R^{21}$ and $R_{22}$ each independently represent a hydrogen atom, an alkyl group, a halogenated alkyl group, an aryl group different from the condensed polycyclic aromatic group, or a heteroaryl group. Z may be a monovalent group represented by Formula (I-1a), (I-2a), or (I-2b), or a monovalent group represented by Formula (I-1a) or (I-2b).

The aryl group for $R^{11}$ or $R^{12}$ can be a residue formed by removing one hydrogen atom from an aromatic compound. The number of carbon atoms of the aryl group is, for example, 6 to 14. Specific examples of the aryl group include residues formed by removing one hydrogen atom from substituted or unsubstituted benzene, substituted or unsubstituted naphthalene, substituted or unsubstituted anthracene, or substituted or unsubstituted phenanthrene. In particular, $R^{11}$ and $R^{12}$ may be a substituted or unsubstituted phenyl group.

The number of carbon atoms of the alkyl group and the halogenated alkyl group for $R^{21}$ or $R^{22}$ may be 1 to 15, 1 to 5, or 1 to 3. The halogenated alkyl group may be a fluorinated alkyl group such as a trifluoromethyl group. Examples of the aryl group and the heteroaryl group for $R^{21}$ or $R^{22}$ include a phenyl group, a naphthyl group, and a thienyl group. $R^{21}$ may be a methyl group, a trifluoromethyl group, a tert-butyl group, or a phenyl group. $R^{22}$ may be a hydrogen atom. The hydrogen atom for $R^{22}$ may be a deuterium atom.

The ligand having a condensed polycyclic aromatic group may be, for example, a bidentate phosphine oxide ligand represented by the following Formula (30). Z, $R^{11}$, and $R^{12}$ in Formula (30) are similarly defined as Z, $R^{11}$, and $R^{12}$ in Formula (10). The phosphine oxide ligand of Formula (30) is generally coordinate-bonded to two rare-earth ions. Two or more rare-earth ions may be linked to each other through the phosphine oxide ligand of Formula (30). Z in Formula (30) may be a divalent group of Formula (I-1b) mentioned above.

(30)

The rare-earth complex may further have other ligands in addition to the ligand having a condensed polycyclic aromatic group. Examples of the other ligands include a phosphine oxide ligand represented by the following Formula (11) and a diketone ligand represented by the following Formula (21).

(11)

(21)

In Formula (11), $R^{13}$, $R^{14}$, and $R^{15}$ each independently represent an aryl group different from the condensed polycyclic aromatic group derived from the condensed polycyclic aromatic compound of Formula (I) mentioned above. Examples of the aryl group for $R^{13}$, $R^{14}$, or $R^{15}$ include the same as those for $R^{11}$ and $R^{12}$ in Formula (10). $R^{13}$, $R^{14}$, and $R^{15}$ may be a substituted or unsubstituted phenyl group.

In Formula (21), $R^{23}$, $R^{24}$, and $R^{25}$ each independently represent a hydrogen atom, an alkyl group, a halogenated alkyl group, an aryl group different from the condensed polycyclic aromatic group derived from the condensed polycyclic aromatic compound of Formula (I) mentioned above, or a heteroaryl group. Examples of $R^{23}$, $R^{24}$, and $R^{25}$ include the same as those for $R^{21}$ and $R_{22}$ in Formula (20). $R^{23}$ and $R^{25}$ each independently may be a methyl group, a trifluoromethyl group, a tert-butyl group, or a phenyl group, and $R^{24}$ may be a hydrogen atom. The hydrogen atom for $R^{24}$ may be a deuterium atom.

The rare-earth complex including the diketone ligand represented by Formula (20) or Formula (21) may have still further excellent properties from the viewpoint of strong emission and the like. For this reason, as the ligand of the rare-earth complex, a combination of the diketone ligand represented by Formula (20) and having a condensed polycyclic aromatic group and the phosphine oxide ligand represented by Formula (11) or a combination of the diketone ligand represented by Formula (21) and the phosphine oxide ligand represented by Formula (10) and having a condensed polycyclic aromatic group may be selected. For example, the rare-earth complex may be a complex represented by the following Formula (C1) or (C2). In Formulas (C1) and (C2), Ln(III) represents a trivalent rare-earth ion.

(C1)

(C2)

The rare-earth complex having a diketone ligand may have a bidentate ligand represented by Formula (30). As an example thereof, a complex represented by the following (C3) is mentioned. The definition of each symbol in Formula (C3) is the same as described above. In the complex represented by Formula (C3), two rare-earth ions Ln(III) are linked to each other by two bidentate ligands.

(C3)

Like a rare-earth complex represented by the following Formula (C4), a repeating structure may be formed by linking the bidentate phosphine oxide ligand represented by Formula (30) and the rare-earth ion alternately. The definition of each symbol in Formula (C4) is the same as described above, and n is an integer of 2 or more representing the number of repetitions.

(C4)

The rare-earth complex according to the present embodiment and the ligand constituting this rare-earth complex can be synthesized by general methods. An example of the method for synthesizing a ligand having a condensed polycyclic aromatic group includes brominating the condensed polycyclic aromatic compound represented by Formula (I), substituting the introduced bromo group with diarylphosphine, and oxidizing the phosphine group.

The rare-earth complex according to the embodiment, which has been described above, can be configured, alone or in combination with other materials such as a thermoplastic resin, as a light-emitting object efficiently emitting light even at high temperatures and a light-emitting material for forming the light-emitting object, by utilizing the fluorescence properties of the rare-earth complex. The light-emitting object can be used, for example, as light sources in various light-emitting devices such as LEDs. The rare-earth complex according to the present embodiment is also useful as a wavelength conversion material or a security material. The security material is used, for example, for giving encrypted information to various materials such as plastic materials.

Moreover, the rare-earth complex according to the present embodiment can also be used as a light-emitting material for providing a light-emitting function to a laminated glass. A laminated glass according to an embodiment includes two glass plates facing each other and an interlayer disposed between these two glass plates, and the interlayer can have a light-emitting layer containing the rare-earth complex according to the present embodiment. This laminated glass is assumed to be applied, for example, as a windshield for a vehicle which undergoes self-luminescence to display information such as characters.

EXAMPLES

Hereinafter, the present invention will be described in more detail by means of Examples. However, the present invention is not limited to these Examples.

Example 1

1. Synthesis of Rare-Earth Complex 1-1. Ligand Precursor: 6-Bromochrysene

6-Bromochrysene

Under an argon atmosphere, chrysene (1.00 g, 4.38 mmol) and N-bromosuccinimide (788 mg, 4.43 mmol) were dissolved in dehydrated DMF (30 mL) to prepare a reaction solution, and this reaction solution was stirred at 60° C. for 20 hours. Next, the reaction solution was mixed with distilled water (200 mL), thereby generating the precipitate. The generated precipitate was recovered by suction filtration. The recovered precipitate was washed with distilled water, methanol, and hexane and vacuum-dried, thereby obtaining powder of 6-bromochrysene (yield rate: 91%, yield: 1.22 g (3.97 mmol). The resulting product was identified by $^1$H-NMR.

$^1$H-NMR (400 MHZ, CDCl$_3$/TMS) δ/ppm=9.07 (s, 1H), 8.80 (d, 1H, J=7.2 Hz), 8.71 (dd, 2H, J=9.6 Hz, 10 Hz), 8.45 (d, 1H, J=9.6 Hz), 8.02 (dd, 2H, J=9.2 Hz, 6.0 Hz), 7.79-7.72 (m, 3H), 7.68-7.65 (m, 1H)

1-2. Ligand: 6-(Diphenylphosphoryl) Chrysene (DPCO)

1-3. Rare-earth complex: $Eu(hfa)_3(DPCO)_2$

6-Bromochrysene (1.22 g, 3.97 mmol) was dissolved in dehydrated DMA (14 mL), and potassium acetate (481 mg, 4.90 mmol) and palladium (II) acetate (8.8 mg, $3.91×10^{-2}$ mmol) were added thereto, thereby preparing a reaction solution. When diphenylphosphine (0.70 mL, 4.03 mmol) was added to the reaction solution under an argon atmosphere, the color of the reaction solution was promptly changed into dark red. Subsequently, the reaction solution was stirred at 60° C. for 24 hours. The reaction solution was mixed with distilled water (200 mL), thereby generating the precipitate. The generated precipitate was recovered by suction filtration, the recovered precipitate was extracted with dichloromethane (30 mL×3), and the resulting dichloromethane solution was washed with saturated saline. Dichloromethane was distilled off from the dichloromethane solution with an evaporator, and the residual solid was mixed with hydrogen peroxide (about 3 mL) in chloroform (30 mL). The obtained reaction solution was stirred at room temperature for 3 hours. Next, the reaction solution was extracted with chloroform (30 mL×3), and the obtained chloroform solution was washed with saturated saline. Chloroform was distilled off from the chloroform solution with an evaporator to obtain a solid crude product. The crude product was purified with silica gel chromatography (developing solvent: dichloromethane/ethyl acetate=8/2). The obtained product was further recrystallized from dichloromethane. The obtained crystals of DPCO were identified based on $^1$H-NMR, ESI-Mass, and elemental analysis (yield rate: 40%, yield: 733 mg, 1.56 mmol). $^1$H-NMR (400 MHZ, $CDCl_3$/TMS) δ/ppm=8.83 (d, 1H, J=8.0 Hz), 8.73 (dd, 2H, J=6.0 Hz, 3.2 Hz), 8.63 (d, 1H, J=17 Hz), 8.11 (d, 1H, J=9.2 Hz), 8.05 (d, 1H, J=8.0 Hz), 8.98 (d, 1H, J=8.0 Hz), 7.79 (dd, 4H, J=6.8 Hz, 5.2 Hz), 7.71 (t, 1H, J=8.0 Hz, 7.6 Hz), 7.65-7.50 (m, 9H) ESI-MS: m/z calcd. for C30H22OP $[M+H]^+$=429.14; found: 429.14 elemental analysis calcd. (%) for $C_{30}H_{21}OP+0.5CH_2Cl_2$,C 77.79, H 4.71; found: C 77.66, H 4.53

DPCO (180 mg, 0.419 mmol) and $Eu(hfa)_3(H2O)_2$(531 mg, 0.66 mmol) were mixed in dichloromethane (15 mL), and the obtained reaction solution was stirred at room temperature for 12 hours. The reaction solution was filtered by suction, and the solvent was distilled off from the filtrate by an evaporator, thereby obtaining a powdery crude product. This powdery crude product was recrystallized from dichloromethane, thereby obtaining crystals of a target europium complex $Eu(hfa)_3(DPCO)_2$. The obtained crystals were identified by ESI-Mass, elemental analysis, and FT-IR (yield rate: 36%, yield: 251 mg, 0.15 mmol).
ESI-MS: m/z calcd for $C_{70}H_{41}EuF_{12}O_6P_2$ $[M-hfa]^+$= 1421.15; found: 1421.16
elemental analysis calcd. (%) for $C_{75}H_{42}EuF_{18}O_8P_2$+ $0.5CH_2Cl_2$,C 53.32, H 2.59; found: C 53.52, H 2.52
IR (ATR)=1653(st, C=O), 1251(st, C—F), 1133(st, P=O) cm-1

1-4. Rare-earth complex: $Eu(hfa)_3(TPPO)_2$

For comparison, a europium complex $Eu(hfa)_3(TPPO)_2$ represented by the following formula was prepared.

Figure 1:
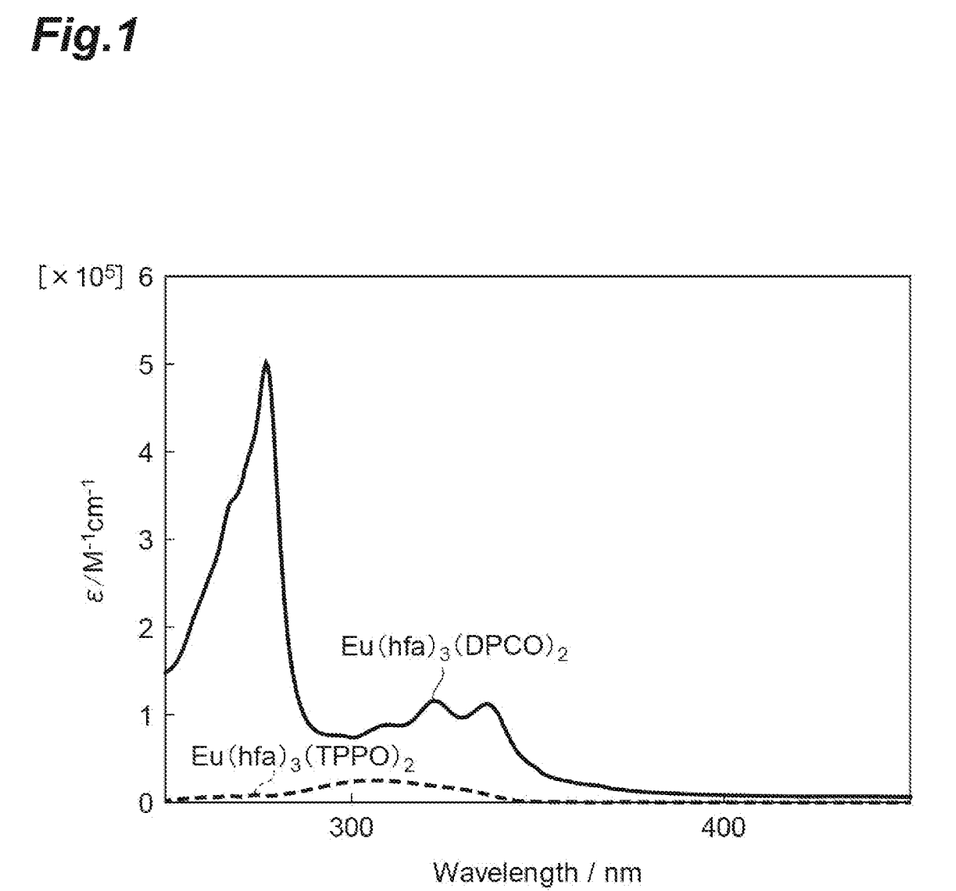
FIG. 1 is ultraviolet-visible light absorption spectra of $Eu(hfa)_3(DPCO)_2$ and $Eu(hfa)_3(TPPO)_2$.

2. Evaluation
2-1. Ultraviolet-visible light absorption light absorption properties Ultraviolet-visible of $Eu(hfa)_3(DPCO)_2$ and $Eu(hfa)_3(TPPO)_2$ were measured by using deuterated chloroform solutions thereof. FIG. 1 is ultraviolet-visible light absorption spectra of Eu(hfa)$_3$(DPCO)$_2$ and Eu(hfa)$_3$(TPPO)$_2$. Eu(hfa)$_3$(DPCO)$_2$ showed an extremely large molar extinction coefficient for the Eu(III) complex that was maximally about 500000 cm$^{-1}$M$^{-1}$.

2-2. Excitation and emission spectra

Figure 2:
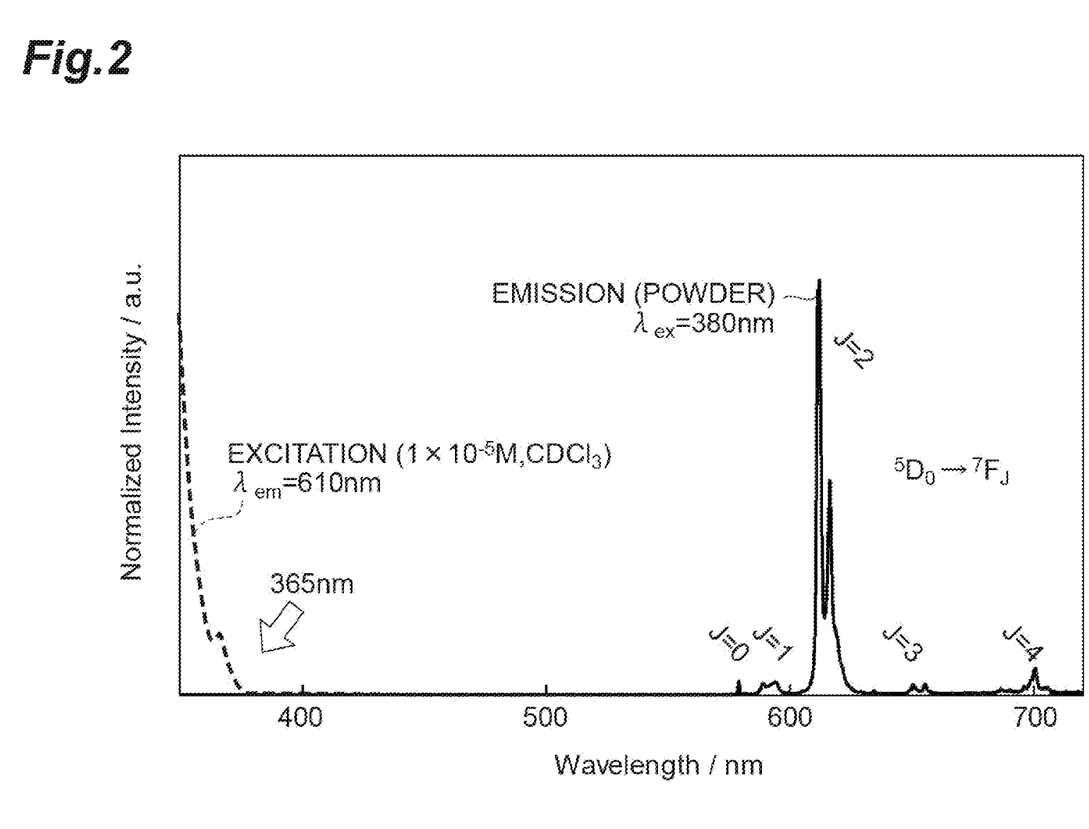
FIG. 2 is excitation and emission spectra of $Eu(hfa)_3(DPCO)_2$.

FIG. 2 is excitation and emission spectra of Eu(hfa)$_3$(DPCO)$_2$. The excitation spectrum was measured by using a CDCl$_3$ solution of Eu(hfa)$_3$(DPCO)$_2$ and setting a fluorescence wavelength λem to 610 nm. The emission spectrum was measured by using powder of Eu(hfa)$_3$(DPCO)$_2$ and setting an excitation wavelength λex to 380 nm. The emission intensity per one molecule of Eu(hfa)$_3$(DPCO)$_2$ at 365 nm was 40 times or more the existing data of Eu(hfa)$_3$(TPPO)$_2$.

2-3. Thermogravimetry-differential thermal analysis (TG-DTA)

Figure 3:
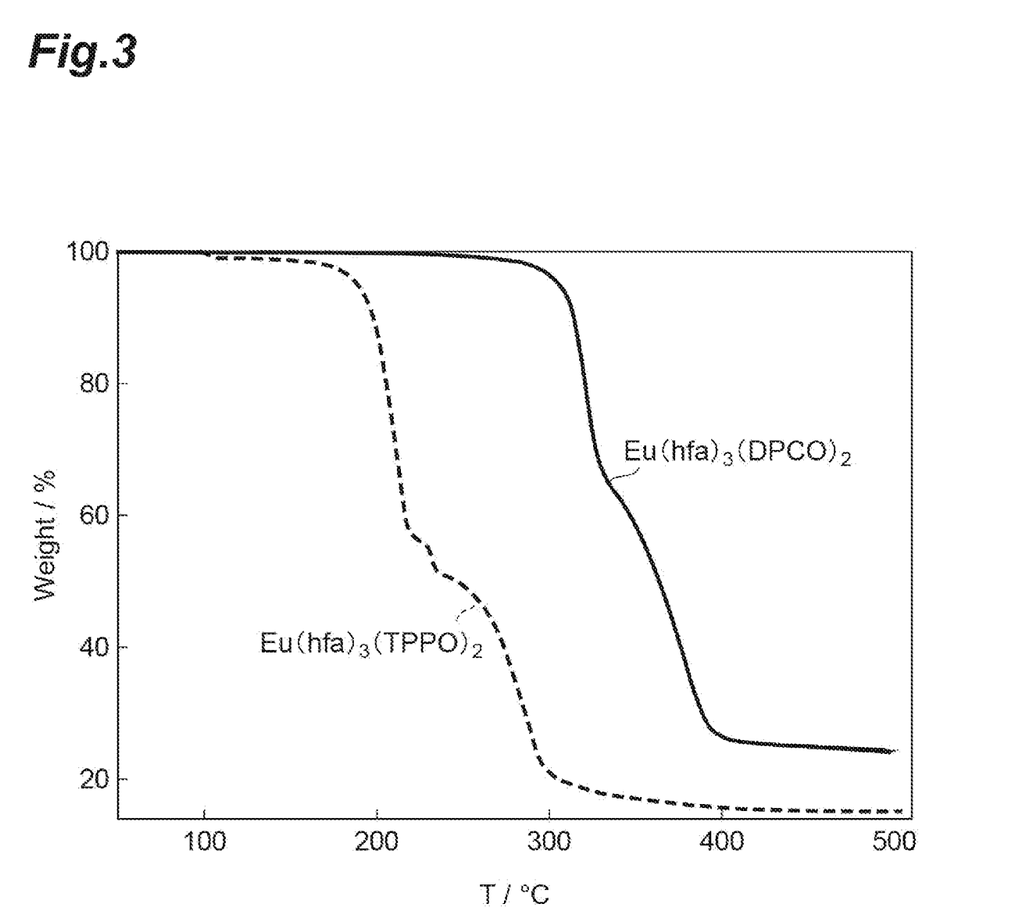
FIG. 3 is a graph showing results of thermogravimetry-differential thermal analysis of $Eu(hfa)_3(DPCO)_2$ and $Eu(hfa)_3(TPPO)_2$.

FIG. 3 is a graph showing results of thermogravimetry-differential thermal analysis of Eu(hfa)$_3$(DPCO)$_2$ and Eu(hfa)$_3$(TPPO)$_2$. It was confirmed that Eu(hfa)$_3$(DPCO)$_2$ shows a high decomposition temperature exceeding 300° C.

2-4. Thermosensitivity

Figure 4:
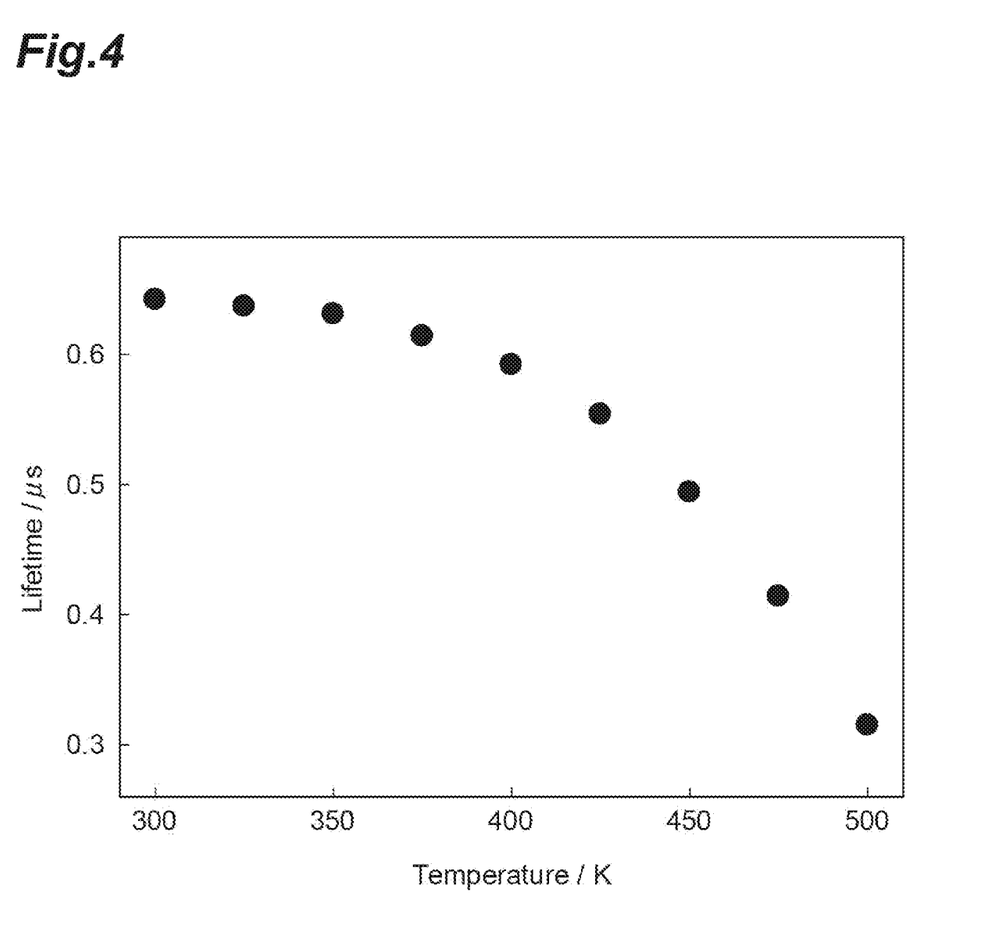
FIG. 4 is a graph showing a relation between emission lifetime of $Eu(hfa)_3(DPCO)_2$ and temperatures.

FIG. 4 is a graph showing a relation between emission lifetime of Eu(hfa)$_3$(DPCO)$_2$ and temperatures. It was confirmed that the emission lifetime of Eu(hfa)$_3$(DPCO)$_2$ greatly changes depending on temperatures. Therefore, the rare-earth complex according to the aspect of the present invention has strong emission properties as well as a temperature sensing function.

Example 2

1. Synthesis of rare-earth complex
1-1. Ligand precursor: 5-bromopicene

5-Bromopicene

Picene (1.00 g, 3.59 mmol) was dissolved in chlorobenzene (100 mL). Br$_2$(0.19 mL, 3.6 mmol) was added dropwise thereto, and then the reaction liquid was stirred at 60° C. for 33 hours. The reaction liquid was cooled to 0° C. The deposited precipitate was recovered by suction filtration and washed with ethanol, thereby obtaining powder of 5-bromopicene. The obtained powder was identified by $^1$H-NMR (yield rate: 75% (967.0 mg, 2.71 mmol)).

$^1$H-NMR (400 MHZ, CDCl$_3$/TMS) δ/ppm=9.14 (s, 1H), 9.02-8.91 (m, 2H), 8.86 (t, 2H, J=7.6 Hz, 8.4 Hz), 8.70 (d, 1H, J=9.7 Hz), 8.47 (dd, 1H, J=6.3 Hz, 2.1 Hz), 8.05 (dd, 2H, J=4.4 Hz, 9.2 Hz), 7.82-7.44 (m, 3H), 7.68 (t, 1H, J=8.0 Hz, 8.4 Hz)

1-2. Ligand: 5-(diphenylphosphoryl) picene (PIPO)

PIPO

Under an argon atmosphere, 5-bromopicene (966.5 mg, 2.71 mmol), potassium acetate (333.4 mg, 3.40 mmol), and palladium (II) acetate (7.0 mg, 0.03 mmol) were dissolved in dehydrated DMA (50 mL) while being heated at 100° C. When diphenylphosphine (0.47 mL, 2.7 mmol) was added to the obtained solution, the color of the solution was promptly changed into dark red. After being stirred at 100° C. for 24 hours, the reaction solution was mixed with distilled water (200 mL), and the deposited powder was recovered by suction filtration. A product was extracted from the obtained powder by using dichloromethane (30 mL×3) and saturated saline, and the solvent was distilled off from the dichloromethane solution by an evaporator. The solidified residue was mixed with an aqueous solution of 30% hydrogen peroxide (about 3 mL) in chloroform (50 mL), and the obtained mixed liquid was stirred for 3 hours at room temperature. A product was extracted from the mixed liquid by using chloroform (30 mL×3) and saturated saline, and the solvent was distilled off from the chloroform solution by an evaporator. A product was separated from the residual crude product by silica gel (60 N) chromatography (developing solvent: dichloromethane/ethyl acetate =8/2). The obtained product was recrystallized from dichloromethane and a small amount of hexane, thereby obtaining crystals of PIPO. The obtained crystals were identified by $^1$H-NMR, ESI-Mass, and elemental analysis (yield rate: 38% (650.8 mg, 1.36 mmol)).

$^1$H-NMR (400 MHZ, CDCl$_3$/TMS) δ/ppm=9.06 (d, 1H, J=9.6 Hz), 8.96 (d, 1H, J=9.2 Hz), 8.90 (d, 1H, J=8.4), 8.84 (d, 1H, J=8.8 Hz), 8.72 (t, 2H, J=8.4 Hz, 9.2 Hz), 7.96 (d, 1H, J=8.0 Hz), 7.90 (d, 1H, J=9.2 Hz), 7.83 (dd, 2H, J=6.8 Hz, 1.2 Hz), 7.69-7.62 (m, 3H), 7.59-7.52 (m, 5H)

ESI-MS: m/z calcd. for C$_{34}$H$_{24}$OP, [M+H]$^+$=479.16; found: 479.16; elemental analysis calcd. (%) for C 85.34, H 4.84; found: C 84.67, H 4.70

1-3. Rare-earth complex: Eu(hfa)₃(PIPO)₂

Eu(hfa)₃(PIPO)₂

PIPO (336.4 mg, 0.703 mmol) and Eu(hfa)₃(H₂O)₂(406.3 mg, 0.502 mmol) were dissolved in dichloromethane (10 mL). The reaction solution was stirred at 12 hours at room temperature and then filtered, and the solvent was distilled off from the filtrate by an evaporator. The residual powder was recrystallized at −18° C. from dichloromethane and a small amount of hexane, thereby obtaining crystals of Eu(hfa)₃(PIPO)₂. The obtained crystals were identified by ESI-Mass, elemental analysis, and IR (yield rate: 68% (409.4 mg, 0.237 mmol)).

ESI-MS: m/z calcd. for $C_{78}H_{48}EuF_{12}O_6P_2$, [M-hfa]⁺=1523.19; found: 1523.18; elemental analysis calcd. (%) for C 57.62, H 2.85, found: C 56.99, H: 2.60; IR (ATR)=1653 (st, C=O), 1252 (st, C—F), 1145 (st, P=O) cm⁻¹

2. Excitation and Emission Spectra

Figure 5:
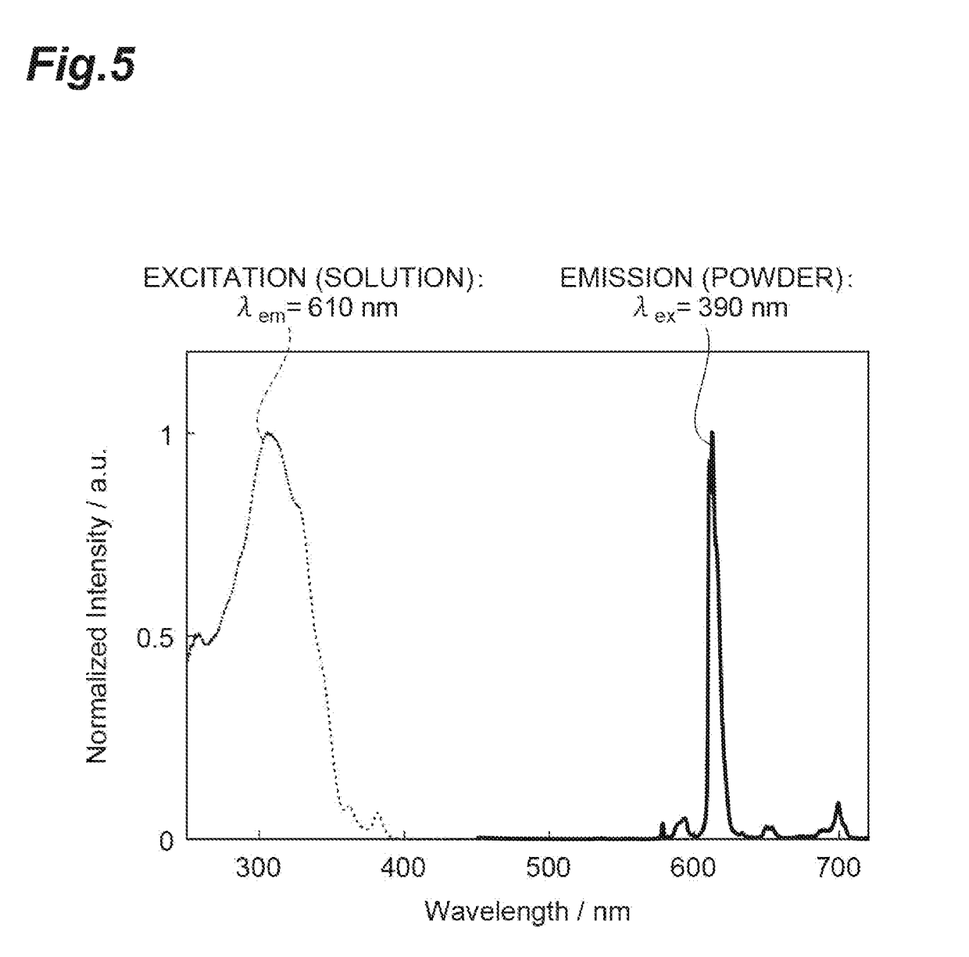
FIG. 5 is excitation and emission spectra of $Eu(hfa)_3(PIPO)_2$.

FIG. 5 is excitation and emission spectra of Eu(hfa)₃ (PIPO)₂. The excitation spectrum was measured by using a CHCl₃ solution (9.8×10⁻⁵ M) of Eu(hfa)₃(PIPO)₂ and setting a fluorescence wavelength λem to 610 nm. The emission spectrum was measured by using powder of Eu(hfa)₃ (PIPO)₂ and setting an excitation wavelength $\lambda_{ex}$ to 390 nm. The emission intensity per one molecule of Eu(hfa)₃(PIPO)₂ at 365 nm was 20 times or more the existing data of Eu(hfa)₃(TPPO)₂.

Example 3

1. Synthesis of Rare-Earth Complex
1-1. Ligand: 6,12-bis(diphenylphosphoryl) chrysene (6,12-DPCO)

Under an argon atmosphere, 6,12-dibromochrysene (678.3 mg, 1.76 mmol), potassium acetate (471.0 mg, 4.80 mmol), and palladium (II) acetate (8.6 mg, 0.04 mmol) were dissolved in dehydrated DMA (40 mL) while being heated at 100° C. When diphenylphosphine (0.45 mL, 2.6 mmol) was added to the obtained solution, the color of the solution was promptly changed into dark red. After being stirred at 100° C. for 42 hours, the reaction solution was mixed with distilled water (200 mL), and the deposited powder was recovered by suction filtration. A product was extracted from the obtained powder by using dichloromethane (30 mL×3) and saturated saline, and the solvent was distilled off from the dichloromethane solution by an evaporator. The solidified residue was mixed with a solution of 30% hydrogen peroxide (about 3 mL) in chloroform (50 mL), and the obtained mixed liquid was stirred for 3 hours at room temperature. A product was extracted from the mixed liquid by using chloroform (30 mL×3) and saturated saline, and the solvent was distilled off from the chloroform solution by an evaporator. A product was separated from the residual crude product by silica gel (60 N) chromatography. The developing solvent was changed from the mixed liquid of dichloromethane/ethyl acetate=1/1 until ethyl acetate remained alone. The obtained product was recrystallized from dichloromethane and a small amount of hexane, thereby obtaining crystals of 6,12-DPCO. The obtained crystals were identified by ¹H-NMR, ESI-Mass, and elemental analysis (yield rate: 49% (546.0 mg, 0.869 mmol)). ¹H-NMR (400 MHZ, CDCl₃/TMS) δ/ppm=8.73 (d, 2H, J=8.4 Hz), 8.63 (s, 1H), 8.59 (s, 1H), 8.08 (d, 2H, J=8.4 Hz), 7.78 (dd, 8H, J=4.0 Hz, 8.0 Hz), 7.63 (t, 4H, J=8.0 Hz, 6.8 Hz), 7.58-7.49 (m, 12H) ESI-MS: m/z calcd. for $C_{42}H_{31}O_2P_2$, [M+H]⁺=629.18; found: 629.18; elemental analysis calcd. (%) for C 80.12, H 4.96; found: C 79.97, H 4.66

1-3. Rare-earth complex: [Eu(hfa)$_3$(6,12-DPCO)]$_n$ 6,12-DPCO (281.4 mg, 0.448 mmol) and Eu(hfa)$_3$(H$_2$O)$_2$(370.5 mg, 0.457 mmol) were dissolved in dichloromethane (15 mL). The reaction solution was stirred at 12 hours at room temperature, and then the deposited precipitate was recovered by filtration, thereby obtaining powder of [Eu(hfa)$_3$(6,12-DPCO)]$_n$. The obtained powder was dissolved in THF and recrystallized. The obtained crystals were identified by ESI-Mass, elemental analysis, and IR (yield rate: 13% (82.1 mg)).
ESI-MS: m/z calcd. for C52H$_{32}$EuF$_{12}$O$_6$P$_2$, [M-hfa]$^+$=1195.07; found: 1195.14, calcd. for C109H$_{65}$Eu$_2$F$_{30}$O$_{14}$P$_4$$_2$, [M-hfa]$^+$=2596.13; found: 2596.27, calcd. for C151H$_{95}$EU$_2$F$_{30}$O$_{16}$P$_6$, [M-hfa]$^+$=3225.30; found: 3225.43
elemental analysis calcd. (%) for C 48.84, H 2.37; found: C 49.05, H 2.48; IR (ATR)=1653 (st, C=O), 1253 (st, C—F), 1145 (st, P—O) cm-1

2-2. Excitation and Emission Spectra

Figure 6:
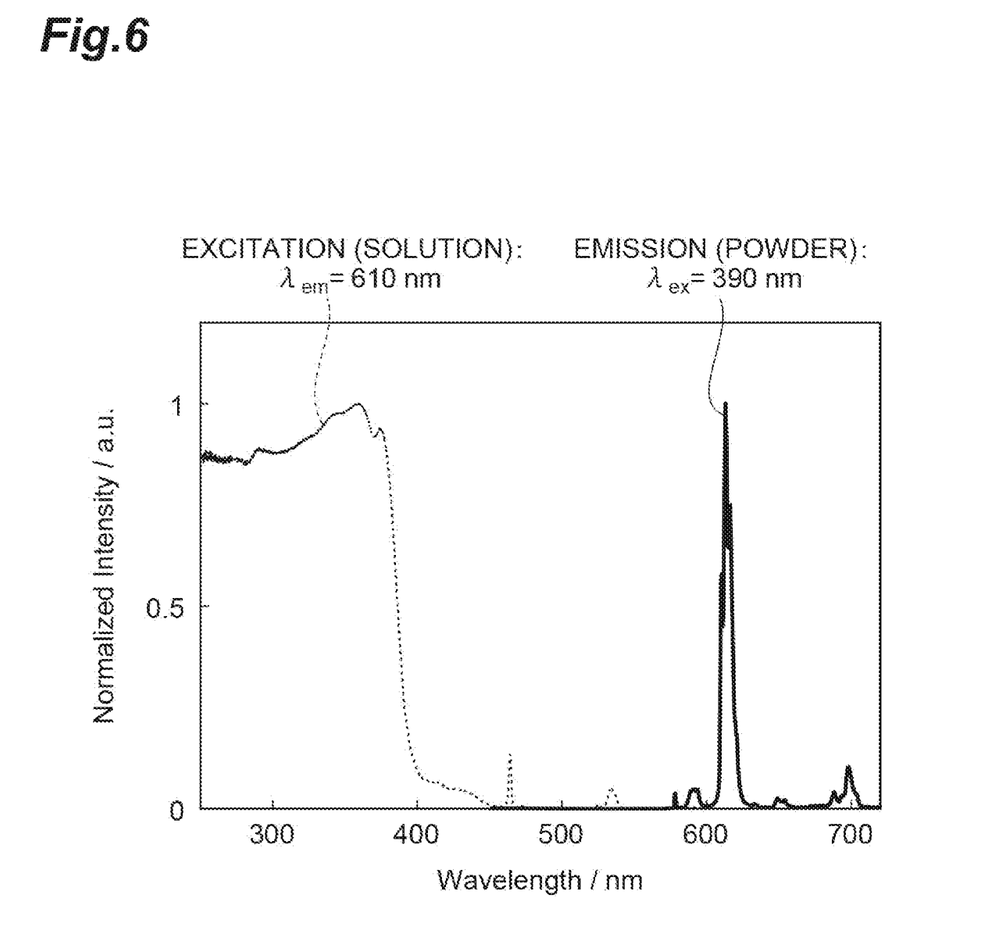
FIG. 6 is excitation and emission spectra of $[Eu(hfa)_3(6,12\text{-}DPCO)]_n$.

FIG. 6 is excitation and emission spectra of [Eu(hfa)$_3$(6,12-DPCO)]$_n$. The excitation spectrum was measured by using powder of [Eu(hfa)$_3$(6,12-DPCO)]$_n$ and setting a fluorescence wavelength $\lambda_{em}$ to 610 nm. The emission spectrum was measured by using powder of [Eu(hfa)$_3$(6,12-DPCO)]$_n$ and setting an excitation wavelength $\lambda_{ex}$ to 390 nm. Similarly to the mononuclear complex, high luminance emission of light was shown.

The invention claimed is:

1. A rare-earth complex comprising: a rare-earth ion; and a ligand coordinate-bonded to the rare-earth ion and having a condensed polycyclic aromatic group, wherein the condensed polycyclic aromatic group is a residue formed by removing a hydrogen atom bonded to a condensed aromatic ring from a condensed polycyclic aromatic compound represented by the following Formula (I):

(I)

in Formula (I), R$^1$ and R$^2$ represent hydrogen atoms or groups which are bonded to each other to form one aromatic ring or a condensed aromatic ring including two or more aromatic rings, and the condensed aromatic ring of the condensed polycyclic aromatic compound represented by Formula (I) optionally has a substituent, wherein the ligand having a condensed polycyclic aromatic group is at least one of a phosphine oxide ligand represented by the following Formula (10) or a diketone ligand represented by the following Formula (20):

(10)

(20)

in Formula (10), Z represents the condensed polycyclic aromatic group, and R$^{11}$ and R$^{12}$ each independently represent an aryl group different from the condensed polycyclic aromatic group, and in Formula (20), Z represents the condensed polycyclic aromatic group, and R$^{21}$ and R$^{22}$ each independently represent a hydrogen atom, an alkyl group, a halogenated alkyl group, an aryl group different from the condensed polycyclic aromatic group, or a heteroaryl group.

2. The rare-earth complex according to claim 1, wherein the ligand having a condensed polycyclic aromatic group is the phosphine oxide ligand represented by the Formula (10), and the rare-earth complex further comprises a diketone ligand coordinate-bonded to the rare-earth ion and represented by the following Formula (21):

(21)

in Formula (21), R$^{23}$, R$^{24}$, and R$^{25}$ each independently represent a hydrogen atom, an alkyl group, a halogenated alkyl group, an aryl group different from the condensed polycyclic aromatic group, or a heteroaryl group.

3. The rare-earth complex according to claim 1, wherein the ligand having a condensed polycyclic aromatic group is the diketone ligand represented by the Formula (20), and the rare-earth complex further comprises a phosphine oxide ligand coordinate-bonded to the rare-earth ion and represented by the following Formula (11):

(11)

in Formula (11), $R^{13}$, $R^{14}$, and $R^{15}$ each independently represent an aryl group different from the condensed polycyclic aromatic group.

4. The rare-earth complex according to claim 1, wherein the rare-earth complex comprises two or more of the rare-earth ions, and
the ligand having a condensed polycyclic aromatic group is a bidentate phosphine oxide ligand represented by the following Formula (30) and the phosphine oxide ligand is coordinate-bonded to two of the rare-earth ions:

(30)

in Formula (30), Z represents the condensed polycyclic aromatic group, and $R^{11}$ and $R^{12}$ each independently represent an aryl group different from the condensed polycyclic aromatic group.

5. The rare-earth complex according to claim 4, wherein the rare-earth complex forms a repeating structure by linking the bidentate phosphine oxide ligand represented by the Formula (30) and the rare-earth ion alternately.

6. The rare-earth complex according to claim 4, wherein the rare-earth complex further comprises a diketone ligand coordinate-bonded to the rare-earth ion and represented by the following Formula (21):

(21)

in Formula (21), $R^{23}$, $R^{24}$, and $R^{25}$ each independently represent a hydrogen atom, an alkyl group, a halogenated alkyl group, an aryl group different from the condensed polycyclic aromatic group, or a heteroaryl group.

7. A light-emitting material comprising the rare-earth complex according to claim 1.

8. A light-emitting object comprising the light-emitting material according to claim 7.

9. A light-emitting device comprising the light-emitting object according to claim 8.

10. An interlayer for a laminated glass comprising a light-emitting layer containing the rare-earth complex according to claim 1.

11. A laminated glass comprising:

two glass plates facing each other; and the interlayer for a laminated glass according to claim 10 disposed between the two glass plates.

12. A windshield for a vehicle, comprising the laminated glass according to claim 11.

13. A wavelength conversion material comprising the rare-earth complex according to claim 1.

14. A security material comprising the rare-earth complex according to claim 1.

* * * * *